United States Patent [19]

Shannon

[11] 3,923,342

[45] Dec. 2, 1975

[54] APPARATUS AND METHOD FOR HANDLING FRANGIBLE OBJECTS

[75] Inventor: Frank Michael Shannon, Tempe, Ariz.

[73] Assignee: Motorola, Inc., Chicago, Ill.

[22] Filed: June 10, 1974

[21] Appl. No.: 477,572

[52] U.S. Cl. ............... 302/2 R; 214/16.4 R; 302/31

[51] Int. Cl.[2] .................... B65G 57/11; B65G 51/02

[58] Field of Search ...... 214/1 BE, 16.4 R; 302/2 R, 302/29, 31

[56] References Cited

UNITED STATES PATENTS

| | | | |
|---|---|---|---|
| 2,696,284 | 12/1954 | Scott et al. | 193/35 A |
| 3,257,964 | 6/1966 | Conners | 302/29 X |
| 3,293,414 | 12/1966 | Barcia | 302/2 R X |
| 3,603,646 | 9/1971 | Leoff | 302/29 |
| 3,645,581 | 2/1972 | Lasch et al. | 302/29 |
| 3,717,381 | 2/1973 | Hagler | 302/31 |
| 3,730,595 | 5/1973 | Yakubowski | 302/2 R |
| 3,731,823 | 5/1973 | Goth | 302/31 X |

*Primary Examiner*—Evon C. Blunk
*Assistant Examiner*—Jeffrey V. Nase
*Attorney, Agent, or Firm*—Harry M. Weiss; Willis E. Higgins

[57] ABSTRACT

An apparatus and method for handling frangible objects, such as semiconductor wafers, uses an air slide to load the wafers into a quartz wafer boat or other carrier positioned at the end of the air slide reliably without damaging the wafers or other objects. The wafer boat is positioned at the end of the air slide at an inclined angle such that the wafers are loaded into slots in the boat and remain in place by force of gravity. In order to prevent damage to the wafers as they are propelled into the slots by the air slide, a vacuum probe on a pedestal is positioned within the carrier at the end of the air slide to grasp the wafer as it enters the slot but before the wafer strikes the back of the slot. The wafer is then released from the vacuum probe and gently settles in place in the slot. The wafer boat is successively indexed to present successive slots to wafer receiving position off the end of the air slide. Use of this apparatus and method allows very rapid loading of semiconductor wafers into a wafer boat under automated conditions without damage to them.

10 Claims, 6 Drawing Figures

APPARATUS AND METHOD FOR HANDLING FRANGIBLE OBJECTS

FIELD OF THE INVENTION

This invention pertains to an apparatus and process for handling frangible objects. More particularly, it relates to apparatus and process for loading plate-like frangible objects such as semiconductor wafers in an automated article handling environment from a conveying means, such as an air slide, to a carrier, such as a wafer boat, without damaging the frangible objects.

DESCRIPTION OF THE PRIOR ART

The manufacture of integrated circuits or discrete semiconductor devices in semiconductor wafers is a highly sophisticated, labor intensive operation. As manufacturing volumes have increased and the manufacturing techniques employed have become more sophisticated, an era of automated wafer handling has begun to develop. A technique that is achieving wide acceptance for transporting the semiconductor wafers from process operation to process operation involves the use of so called "air slides," in which the wafers move along a track while suspended on air jets.

For many process operations, it is necessary to load the semiconductor wafers into wafer boats or other carriers which are arranged to hold the wafers in spaced, parallel relationship to each other in slots. For such a loading operation, it is known to index a wafer boat or other carrier successively at the end of an air slide, which propels the wafers into their slots. Particularly when attempting to carry out this loading operation in a high speed manner, the impact of the wafers against the slots when they are propelled into the wafer boat by the air slide will often chip the wafer edges, or, in extreme cases, actually break the wafers. The choice in semiconductor manufacturing operations has hitherto been either to load the wafers into the wafer boat in a high speed, automated manner while accepting significant product loss due to damage to the wafers in the loading operation or to carry out the loading operation manually.

It should be recognized that automated, precise handling of the semiconductor wafers as they exit from an air slide presents a difficult problem in automated article handling. Semiconductor wafers are typically about three inches in diameter and have a thickness of about ten thousandths of an inch. However, since the wafers are sliced from a thick ingot of silicon, a typical specification for the wafers will allow a variation of 10 percent in their thickness. This means the distance that different thickness wafers are suspended above the air slide surface will vary considerably as the mass of the wafer varies with variations in the thickness of the wafers within the usual ten percent tolerance. Variation in their movement as they are propelled from an air slide to a carrier or other receiving means is therefore also to be expected. Thus, while techniques for manufacturing semiconductor devices and for handling semiconductor wafers are highly developed, there remains a need for further development of an apparatus and process for automated loading of semiconductor wafers from an air slide or other conveying means to a wafer boat or other carrier.

SUMMARY OF THE INVENTION

Accordingly, it is an object of this invention to provide an apparatus and method for reliably loading frangible objects from a conveying means into slots of a carrier on an automated basis without breaking or damaging the objects.

It is another object of the invention to provide a method and apparatus for the automated handling of frangible objects exiting from an air slide, which objects have considerable variation in their mass.

It is a still further object of the invention to provide means for slowing semiconductor wafers down as they enter slots of a wafer boat from an air slide, thereby to prevent chipping of their edges or breakage of the wafers.

The attainment of these and related objects may be achieved through use of the novel article handling apparatus herein disclosed. The apparatus includes an air slide or other conveying means having an end at which a carrier is positioned to receive semiconductor wafers or other frangible objects from the air slide. The carrier has a plurality of slots, each having a back surface and adapted to receive the frangible object. The carrier is positioned at the end of the conveying means with the slots in the carrier inclined with respect to the conveying means so that the objects will tend to remain in the slots once they have been loaded from the end of the conveying means. A vacuum means or other means for applying a force is positioned within the carrier to releasably grasp the object as it moves into one of the slots prior to impact against the back surface of the slot. Means is provided for successively indexing the carrier to move its slots successively into object receiving position at the end of the conveying means.

In operation, one of the frangible objects is propelled by the conveying means off its end toward a slot that has been indexed into proper position. As the front edge of the object begins to enter the slot, the means for applying a force releasably grasps the object before its impact against the back surface of the slot, and stops the object. The object is then released, allowing the object to settle into the slot gently under the force of gravity. In addition to stopping the objects before they strike against the back surface of the slot into which they are loaded, grasping the objects with the means for applying a force assures that the objects enter the slots in a reproducible manner, even though the mass of the objects may vary considerably, and consequently their path of travel as they exit from the conveying means.

The attainment of the foregoing and related objects, advantages and features of the invention should be apparent after review of the following detailed description of the invention, taken in conjunction with the drawings.

DETAILED DESCRIPTION OF THE INVENTION

Turning now to the drawings, more particularly to

Figure 1:
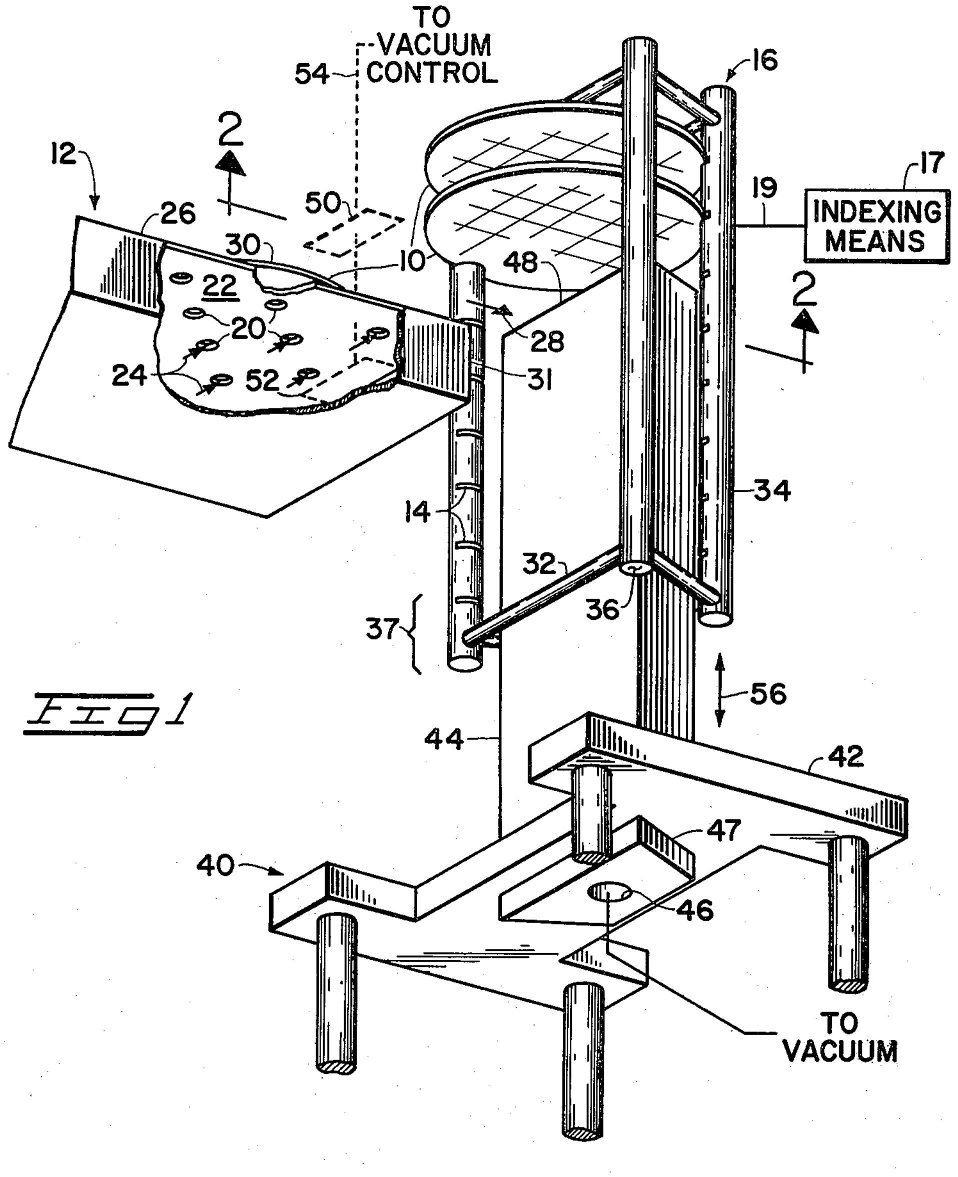
FIG. 1 represents a perspective view in partial cross section of an apparatus in accordance with the invention for loading semiconductor wafers into a wafer boat.
Figure 2:
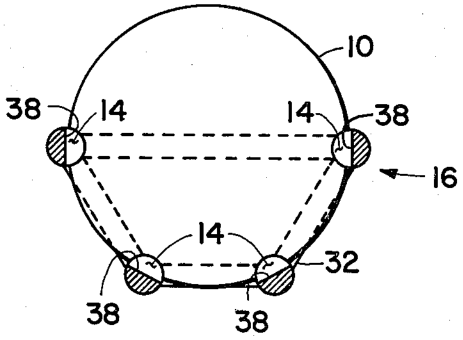
FIG. 2 is an end view of the wafer boat in FIG. 1, with a section taken along the line 2—2 in FIG. 1.
Figure 3:
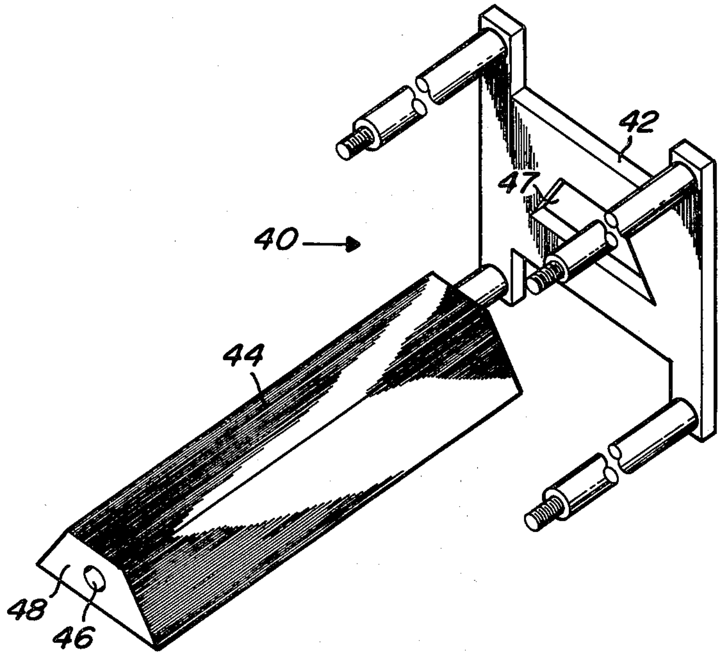
FIG. 3 is a perspective view of a portion of the apparatus in FIG. 1.

FIGS. 1, 2 and 3, there is shown an apparatus in accordance with the invention for loading semiconductor wafers 10 from air slide 12 into slots 14 of the wafer boat 16. FIG. 1 shows air slide 12 having top plate 18 with a large number of air holes 20 throught it. It should be noted that the position of the apparatus in the perspective view of FIG. 1 is only to show detail. The top plate 18 is in a horizontal plane in use of the apparatus and wafer boat 16 is disposed vertically with respect to this horizontal plane. Manifold 22 of the air slide 12 receives air under pressure, which is expelled through opening 20 in the form of air jets 24. The air jets 24 serve to suspend semiconductor wafer 10 above surface 26 of the air slide 12, as well as to propel it in the direction indicated by arrows 28. Conventionally, semiconductor wafer 10 has a top surface 30 into and on top of which integrated circuits or other semiconductor devices are fabricated. The wafer, and especially top surface 30, is susceptible to damage by contact, such as by scratching, chipping or breakage.

Figure 4A:
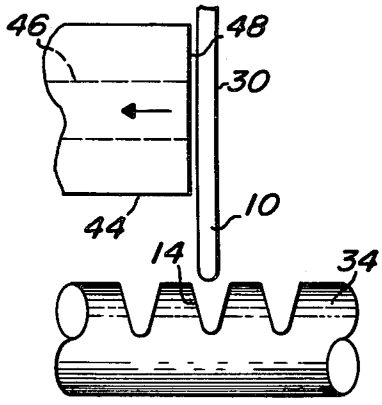
FIGS. 4A–4C are an enlargement of region 4 in FIG. 1 to show operation of the invention.
Figure 4B:
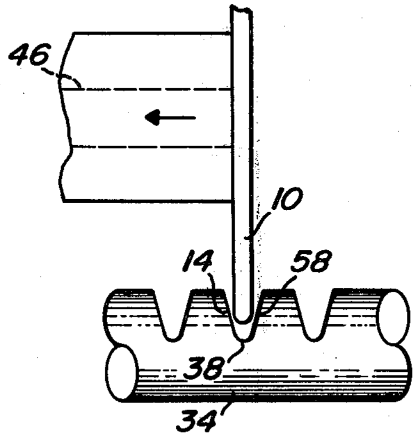
Figure 4C:
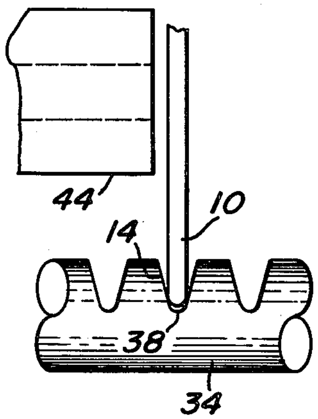

FIG. 1 and 2 show the structural details of wafer boat 16 positioned at end 31 of air slide 12 into which the wafers 10 are located from the air slide with this invention. Wafer boat 16 is fabricated of end quartz rods 32 joined by quartz rods 34 containing slots 14 in the configuration shown. Slots 14 are in the shape of V shaped groves cut approximately half way through the diameter of rod 34 at regular intervals, as best shown in FIG. 2. Ends 36 of the rods 34 are precision ground to a flat surface to give a predetermined distance indicated by bracket 37 from end 36 to first grooves 14 at each end, thus giving an accurate point of reference for precise registration of the slot 14 so that they may be successively indexed into wafer receiving position at the end 31 of air slide 12. FIGS. 2 and 4C show most clearly how a semiconductor wafer 10 rests in grooves 14 when it is loaded into wafer boat 16. It is a sharp impact against bottom 38 of the slots 14 which is avoided through the present invention.

In practice, the wafer boat 16 is inclined from the vertical direction away from end 31 of the air slide 12, so that wafers loaded into slots 14 will remain in position. For this purpose, an inclination angle of from about 10° to about 20° from the vertical is preferred.

Referring now to FIGS. 1 and 3, details of vacuum grasping means 40 are shown. The vacuum grasping means 40 includes chuck 42 and vacuum probe 44. Vacuum hole 46 is located axially along vacuum probe 44 and is connected to a suitable source of vacuum (not shown). Vacuum probe 44 has a trapezoidal cross section and fits through hole 47 in chuck 42. The distance vacuum post 44 extends above chuck 42 can be varied through the use of a suitable adjusting means (not shown), in order to locate top 48 of vacuum probe 44 precisely as required at the end 31 of air slide 12.

In its simplest form, a vacuum may be constantly applied through vacuum hole 46 of the vacuum grasping means 40 except when releasing a wafer 10 for allowing it to settle in place in its slot 14. However, if desired, a photocell 50 and light source 52 may be furnished near the end 31 of air slide 12 for supplying an activating signal on line 54, which is connected to a vacuum control (not shown). In either case, a means (not shown), responsive to blockage of vacuum hole 46 by a wafer 10 on top 48 of vacuum probe 44, is used to release the vacuum once the wafer 10 has stopped its forward motion into slot 14.

In operation, a slot 14 of wafer boat 16 is registered into wafer receiving position through action of indexing means 17, which moves the wafer boat 16 in the direction indicated by arrow 56. A semiconductor wafer 10 is propelled off the end of air slide 12 by air jets 24 toward the slots 14 which are in wafer receiving position. The action of vacuum grasping means 40 to allow gentle loading of the wafer 10 into slots 14 is best understood by referring to FIG. 4A through 4C. As the wafer 10 approaches slot 14 and reaches the position shown in FIG. 4A, the vacuum begins to engage the wafer 10 to end 48 of vacuum post 44. In FIG. 4B, wafer 10 has been fully engaged by the vacuum and has stopped its forward motion into slot 14, though it has not yet touched back surface 38 of slot 14. In usual practice, with top 48 of vacuum probe 44 positioned 5–10 thousandths of an inch below the normal path of travel of wafers 10 as they are propelled off the end of air slide 12, a wafer 10 will travel approximately 60% of the depth of slot 14, indicated by bracket 58, when slot 14 has a depth of about 150 thousandths of an inch, and a vacuum of 26 inches of mercury is pulled through vacuum hole 46.

After the wafer 10 has been stopped by the vacuum probe 44, the vacuum is released, and the wafer 10 gently settles into place in slot 14, as shown in FIG. 4C, without chipping its edges or breaking. Of course, it should be recognized that the operation of the invention as depicted in FIGS. 4A–4C is idealized. In actual operation, the wafers 10 may in fact contact the walls of a slot 14 before it has been fully stopped by the vacuum probe 44 in some instances. However, even in these instances, the use of the vacuum probe 44 makes the impact of the wafer 10 gentle enough so that chipping or breaking of the wafers 10 in the course of loading wafer boats 16 is virtually eliminated as a yield detractor in the fabrication of integrated circuits or other semiconductor devices.

It should now be apparent that an apparatus and method for loading frangible objects into slots of a carrier capable of achieving the stated objects of the invention have been provided. This apparatus and method carries out the loading operation on an automated basis without breaking or damaging the objects by stopping or slowing them down as they enter the slots through the use of a vacuum probe. While the invention is of particular value in loading semiconductor wafers into a wafer boat, it should find wide application in a variety of other situations in which it is desired to load a breakable, plate-like object into slots of a carrier without damaging the objects.

While the invention has been particularly shown and described in reference to the preferred embodiments thereof, it will be understood by those skilled in the art that changes in form and details may be made therein without departing from the spirit and scope of the invention.

What is claimed is:

1. Apparatus for loading frangible objects comprising:

a. conveying means having an end from which the objects are propelled, b. a vacuum probe positioned adjacent the end of said conveying means to releasably grasp an object after it has been propelled off the end of said conveying means, c. a carrier having a plurality of slots each having a back surface into which the objects are to be loaded, said carrier being positioned around said vacuum probe and adjacent to the end of said conveying means, said conveying means terminating prior to entering said carrier, so that said vacuum probe releasably grasps an object after it has been propelled off the end of said conveying means as it moves into one of said slots prior to impact against said back surface, and d. means for successively indexing said carrier to move said slots successively into object receiving position adjacent to the end of said conveying means.

2. Apparatus of claim 1 further comprising:

e. means proximate to the end of said conveying means for sensing the presence of an object moving toward said carrier, and f. means, controlled by said means for sensing, for activating said vacuum probe.

3. Apparatus of claim 1 in which said conveying means is an air slide.

4. Apparatus of claim 3 in which said frangible objects are semiconductor wafers.

5. Apparatus of claim 4 in which the slots of said carrier are indexed at an angle of from about 10 to about 20 degrees with respect to said air slide.

6. Apparatus of claim 1 in which said vacuum probe operates continuously at other times than when releasing a wafer grasped by it.

7. A process for loading frangible objects into a carrier having a plurality of slots each having a back surface, from a conveying means having an end, which comprises:

a. positioning the carrier adjacent to the end of the conveying means, with said slots in an indexed relationship with respect to said conveying means, and the conveying means terminating prior to entering the carrier, b. propelling a said frangible object off the end of the conveying means toward the carrier, c. applying force to a said frangible object after it has been propelled off the end of the conveying means and as it enters a said slot to stop said object before it strikes the back surface of said slot, and d. terminating the application of said force, whereby the frangible object is fed into one of said slots in a manner to prevent damage to it.

8. The process of claim 7 in which said frangible objects are semiconductor wafers.

9. The process of claim 8 in which said force is applied by means of a vacuum.

10. The process of claim 9 in which said conveying means is an air slide.

* * * * *